United States Patent
Karasawa et al.

(10) Patent No.: US 6,864,541 B2
(45) Date of Patent: Mar. 8, 2005

(54) SEMICONDUCTOR DEVICE HAVING A PROTRUDED ACTIVE REGION, MEMORY SYSTEM HAVING THE SAME, AND ELECTRONIC APPARATUS HAVING THE SAME

(75) Inventors: Junichi Karasawa, Tatsuno-machi (JP); Kunio Watanabe, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/072,316

(22) Filed: Feb. 8, 2002

(65) Prior Publication Data

US 2002/0135003 A1 Sep. 26, 2002

(30) Foreign Application Priority Data

Mar. 26, 2001 (JP) .......................... 2001-088309
Oct. 29, 2001 (JP) .......................... 2001-330785

(51) Int. Cl.[7] .................... H01L 29/76; H01L 27/11
(52) U.S. Cl. ........................ 257/369; 257/903
(58) Field of Search .................. 257/903, 904, 257/296, 369, 365, 393

(56) References Cited

U.S. PATENT DOCUMENTS

| | | | |
|---|---|---|---|
| 5,734,187 A | 3/1998 | Bohr et al. | |
| 5,994,719 A | 11/1999 | Kuriyama et al. | |
| 6,090,654 A | 7/2000 | Kim | |
| 6,091,630 A | 7/2000 | Chan et al. | |
| 6,285,088 B1 | * 9/2001 | Madan | 257/903 |
| 6,404,023 B1 | 6/2002 | Mori et al. | |
| 6,469,356 B2 | 10/2002 | Kumagai et al. | |
| 6,479,905 B1 | * 11/2002 | Song | 257/365 |
| 6,507,079 B2 | * 1/2003 | Komori | 257/393 |
| 2002/0096734 A1 | * 7/2002 | Natsume | 257/903 |

FOREIGN PATENT DOCUMENTS

| | | | |
|---|---|---|---|
| JP | 03-040449 | 2/1991 | |
| JP | 07-231044 | 8/1995 | |
| JP | 09-260510 | 10/1997 | |
| JP | 10-41409 | * 2/1998 | 257/903 |
| JP | 10-163344 | 6/1998 | |
| JP | 10-294367 | 11/1998 | |
| JP | 11-017028 | 1/1999 | |
| JP | 2000-036542 | 2/2000 | |
| JP | 2000-208643 | 7/2000 | |
| JP | 2000-269319 | 9/2000 | |

OTHER PUBLICATIONS

U.S. Appl. No. 10/072,855, filed Feb. 6, 2002.
U.S. Appl. No. 10/072,618, filed Feb. 7, 2002.

* cited by examiner

*Primary Examiner*—Steven Loke
(74) *Attorney, Agent, or Firm*—Hogan & Hartson, LLP

(57) ABSTRACT

A semiconductor device is provided with an SRAM memory cell. The semiconductor device includes a first gate-gate electrode layer, a second gate-gate electrode layer, a first drain-drain wiring layer, a second drain-drain wiring layer, a first drain-gate wiring layer and second drain-gate wiring layers. The first drain-gate wiring layer and an upper layer and a lower layer of the second drain-gate wiring layer are located in different layers, respectively. A first protruded active region is provided in a manner to protrude from an end portion of the first active region.

15 Claims, 16 Drawing Sheets

SEMICONDUCTOR DEVICE HAVING A PROTRUDED ACTIVE REGION, MEMORY SYSTEM HAVING THE SAME, AND ELECTRONIC APPARATUS HAVING THE SAME

Japanese Patent Application No. 2001-88309, filed on Mar. 26, 2001 and Japanese Patent Application No. 2001-330785, filed on Oct. 29, 2001, are hereby incorporated by reference in its entirety.

BACKGROUND OF THE INVENTION

The present invention relates to semiconductor devices, such as, for example, static random access memories (SRAMs), and memory systems and electronic apparatuses provided with the same.

SRAMs, one type of semiconductor memory devices, do not require a refreshing operation and therefore have a property that can simplify the system and lower power consumption. For this reason, the SRAMs are prevailingly used as memories for electronic equipment, such as, for example, mobile phones.

BRIEF SUMMARY OF THE INVENTION

The present invention may provide a semiconductor device that can reduce its cell area.

The present invention may further provide a memory system and an electronic apparatus that includes a semiconductor device of the present invention.

1. Semiconductor Device 1.1 First Semiconductor Device

A semiconductor device in accordance with a first aspect of the present invention is provided with a memory cell including a first driver transistor, a second driver transistor, a first transfer transistor, a second transfer transistor, a first load transistor and a second load transistor, and the semiconductor device comprises:

a first gate-gate electrode layer including a gate electrode of the first load transistor and a gate electrode of the first driver transistor;

a second gate-gate electrode layer including a gate electrode of the second load transistor and a gate electrode of the second driver transistor;

a first drain-drain wiring layer which forms a part of a connection layer that electrically connects a drain region of the first load transistor and a drain region of the first driver transistor;

a second drain-drain wiring layer which forms a part of a connection layer that electrically connects a drain region of the second load transistor and a drain region of the second driver transistor;

a first drain-gate wiring layer which forms a part of a connection layer that electrically connects the first gate-gate electrode layer and the second drain-drain wiring layer;

a second drain-gate wiring layer which forms a part of a connection layer that electrically connects the second gate-gate electrode layer and the first drain-drain wiring layer; and a first active region in which the first load transistor is provided, wherein the first drain-gate wiring layer and the second drain-gate wiring layer are located in different layers, respectively, and wherein a first protruded active region is provided in a manner to protrude from an end portion of the first active region.

Here, the "wiring layer" means a conductive layer disposed over a field or an interlayer dielectric layer.

In accordance with this aspect, the second drain-gate wiring layer is located above the first drain-gate wiring layer. In other words, the first drain-gate wiring layer and the second drain-gate wiring layer are located in different layers, respectively. As a result, in accordance with this aspect, the pattern density of a wiring layer in each of the layers where the first drain-gate wiring layer and the second drain-gate wiring layer are formed, respectively, can be reduced and the cell area can be made smaller, compared to the case where the first drain-gate wiring layer and the second drain-gate wiring layer are formed in the same layer.

Further, in accordance with this aspect, the first protruded active region is provided in a manner to protrude from an end portion of the first active region. As a result, for example, contacting area between the drain region of the first load transistor provided in the first active region and a contact section provided in an interlayer dielectric layer can be secured, and their contact resistance can be restrained from increasing. The reasons for this will be described later in the description of embodiments of the present invention.

The semiconductor device of this aspect may take at least any one of the following features.

(A) The first protruded active region may be provided in a manner to protrude on a side opposite to a side where the first and second driver transistors are provided. According to this feature, the first protruded active region can be prevented from reaching a well region in which the first and second driver transistors are provided.

(B) A part of the first active region and the first protruded active region may form an L-shape.

(C) The semiconductor device may comprise a second active region in which the second load transistor is provided; and a second protruded active region provided in a manner to protrude from an end portion of the second active region. In accordance with this feature, for example, contacting area between the drain region of the second load transistor provided in the second active region and a contact section provided in an interlayer dielectric layer can be secured, and their contact resistance can be restrained from increasing. The reasons for this will be described later in the description of embodiments of the present invention.

In the feature of (C), the second protruded active region may be provided in a manner to protrude on a side opposite to a side where the first and second driver transistors are provided. According to this feature, the second protruded active region is prevented from reaching a well region in which the first and second driver transistors are provided.

Further, in the feature of (C), a part of the second active region and the second protruded active region may form an L-shape.

(D) The first drain-gate wiring layer may be electrically connected to the second drain-drain wiring layer through a contact section, and the second drain-gate wiring layer may be electrically connected to the second gate-gate electrode layer through a contact section, and electrically connected to the first drain-drain wiring layer through a contact section.

(E) The first drain-gate wiring layer may be located in a layer lower than the second drain-gate wiring layer.

(F) The first drain-gate wiring layer may be located in a layer in which the first gate-gate electrode layer is provided.

(G) The second drain-gate wiring layer may be formed across a plurality of layers.

In the feature of (G), the second drain-gate wiring layer may include a lower layer of the second drain-gate wiring layer and an upper layer of the second drain-gate wiring layer, and the upper layer may be located in a layer over the lower layer, and electrically connected to the lower layer.

Further, in the feature of (G), the upper layer may be electrically connected to the lower layer through a contact section.

Further, in the feature of (G), the first gate-gate electrode layer, the second gate-gate electrode layer and the first drain-gate wiring layer may be located in a first conductive layer, the first drain-drain wiring layer, the second drain-drain wiring layer and the lower layer may be located in a second conductive layer, and the upper layer may be located in a third conductive layer.

(H) The second conductive layer may be a nitride layer of a refractory metal (for example, titanium nitride). As the second conductive layer is a nitride layer of a refractory metal, the thickness of the second conductive layer can be reduced, and miniaturizing processing can be readily performed. Accordingly, the cell area can be reduced.

(I) The second conductive layer may have a thickness of 100 nm to 200 nm.

1.2 Second Semiconductor Device

A semiconductor device in accordance with a second aspect of the present invention uses as a memory cell a flip-flop including a first load transistor, a first driver transistor, a second load transistor and a second driver transistor, wherein the first and second load transistors in one memory cell are disposed symmetrically about a straight line extending in a gate width direction between drain regions of the first and second load transistors, and wherein each of the drain regions of the first and second load transistors includes a protruded active region protruding in the gate width direction beyond an end of a channel region.

It is noted that, in this aspect, each of the drain regions includes a protruded active region protruding in the gate width direction beyond an end of a channel region. As a result, for example, contacting area between the drain region of the first load transistor and a contact section provided in an interlayer dielectric layer can be secured, and their contact resistance can be restrained from increasing. The reasons for this will be described later in the description of embodiments of the invention.

2. Memory System

A memory system in accordance with a third aspect of the present invention is provided with the semiconductor device in accordance with the above described aspects.

3. Electronic Apparatus

An electronic apparatus in accordance with a fourth aspect of the present invention is provided with the semiconductor device in accordance with the above described aspects.

DETAILED DESCRIPTION OF THE EMBODIMENT

An embodiment of the present invention is described. The present embodiment is the one in which a semiconductor device of the present invention is applied to in an SRAM.

1. Equivalent Circuit of SRAM

Figure 1:
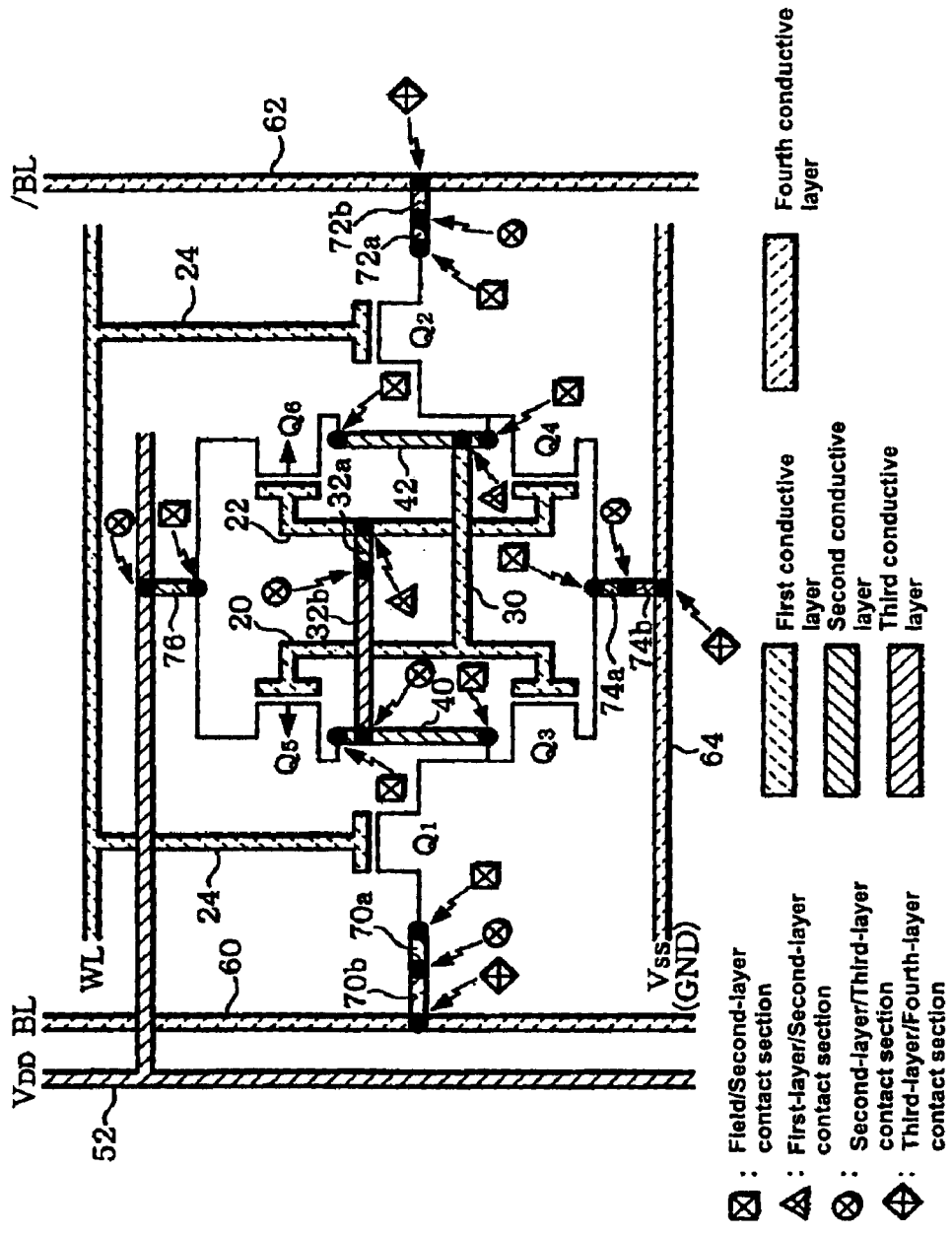
FIG. 1 shows a relationship between an equivalent circuit of an SRAM in accordance with the present embodiment and corresponding conductive layers.

FIG. 1 shows a relationship between an equivalent circuit of an SRAM in accordance with the present embodiment and corresponding conductive layers. The SRAM of the present embodiment is a type in which one memory cell is formed with six MOS field effect transistors. In other words, one CMOS inverter is formed with an n-channel type driver transistor Q3 and a p-channel type load transistor Q5. Also, one CMOS inverter is formed with an n-channel type driver transistor Q4 and a p-channel type load transistor Q6. These two CMOS inverters are cross-coupled to form a flip-flop. Further, one memory cell is formed from this flip-flop and n-channel type transfer transistors Q1 and Q2.

2. Structure of SRAM

A structure of the SRAM is described below. First, each figure is briefly described.

Figure 2:
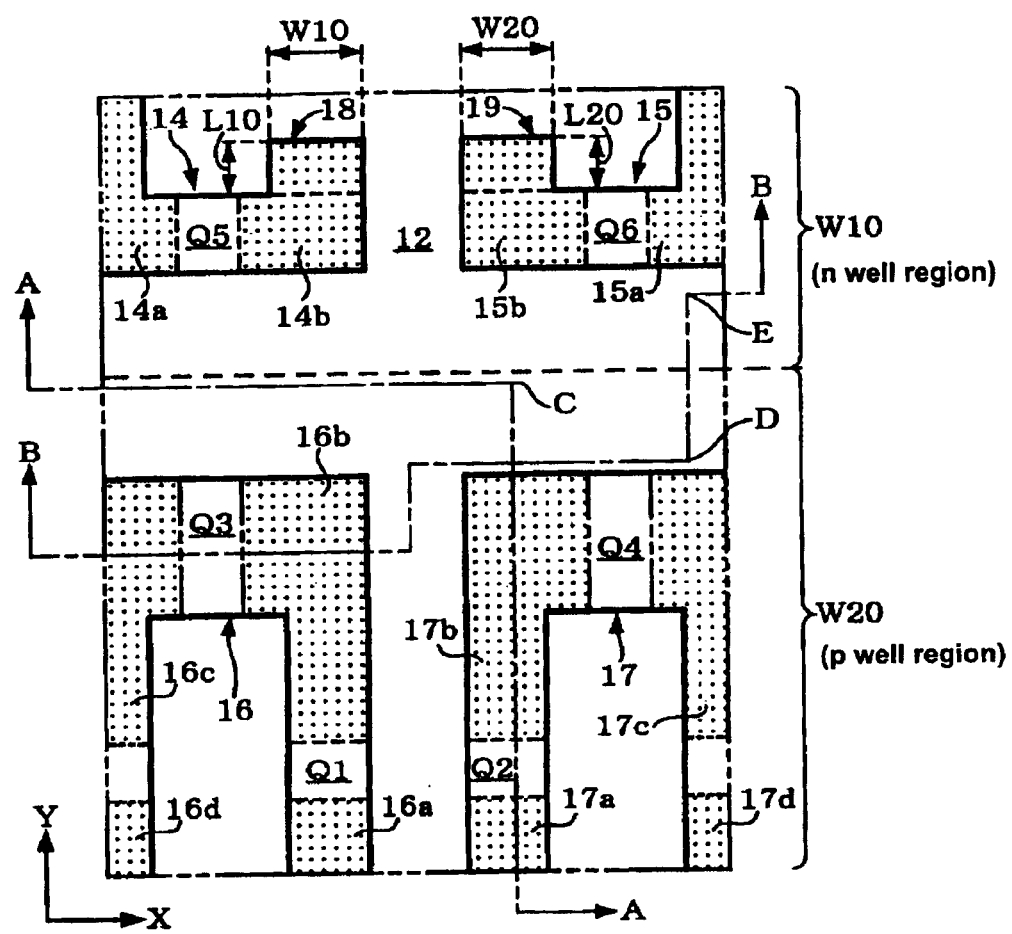
FIG. 2 schematically shows a plan view of a field of the memory cell of the SRAM in accordance with the present embodiment.
Figure 3:
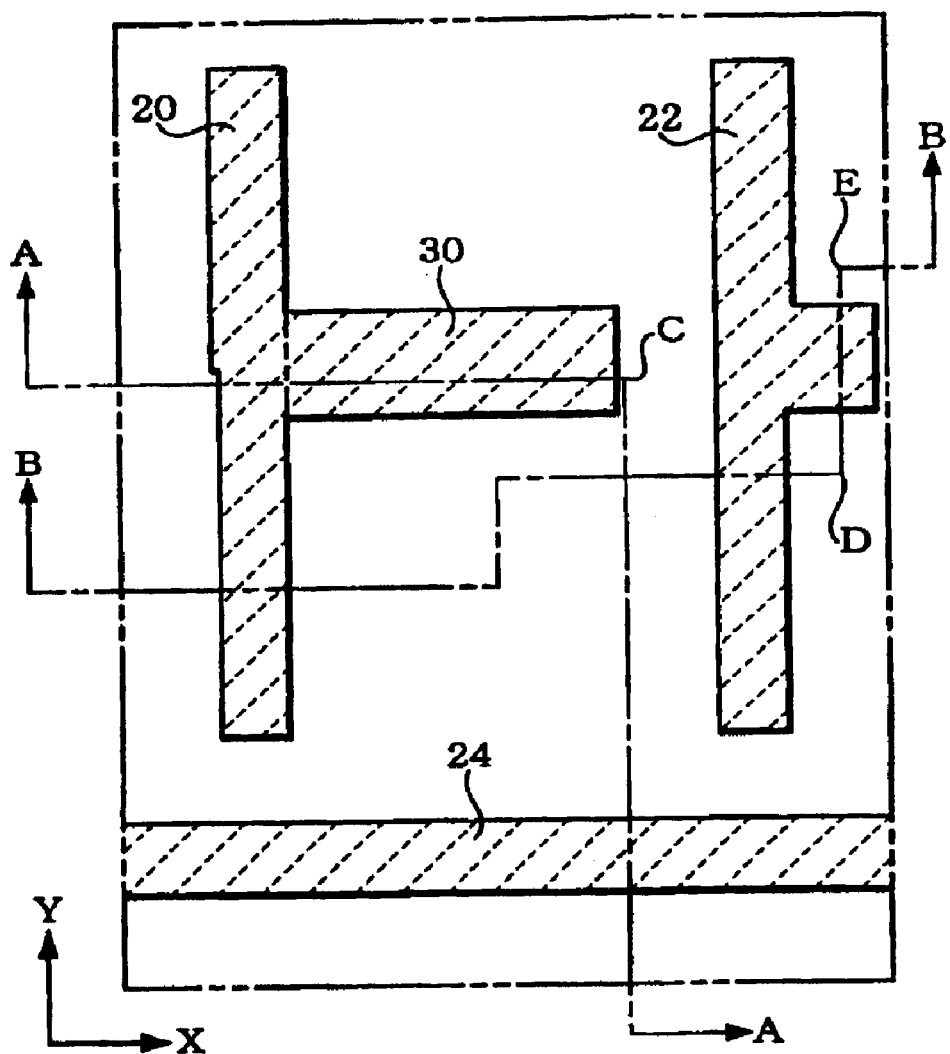
FIG. 3 schematically shows a plan view of a first conductive layer of the memory cell of the SRAM in accordance with the present embodiment.
Figure 4:
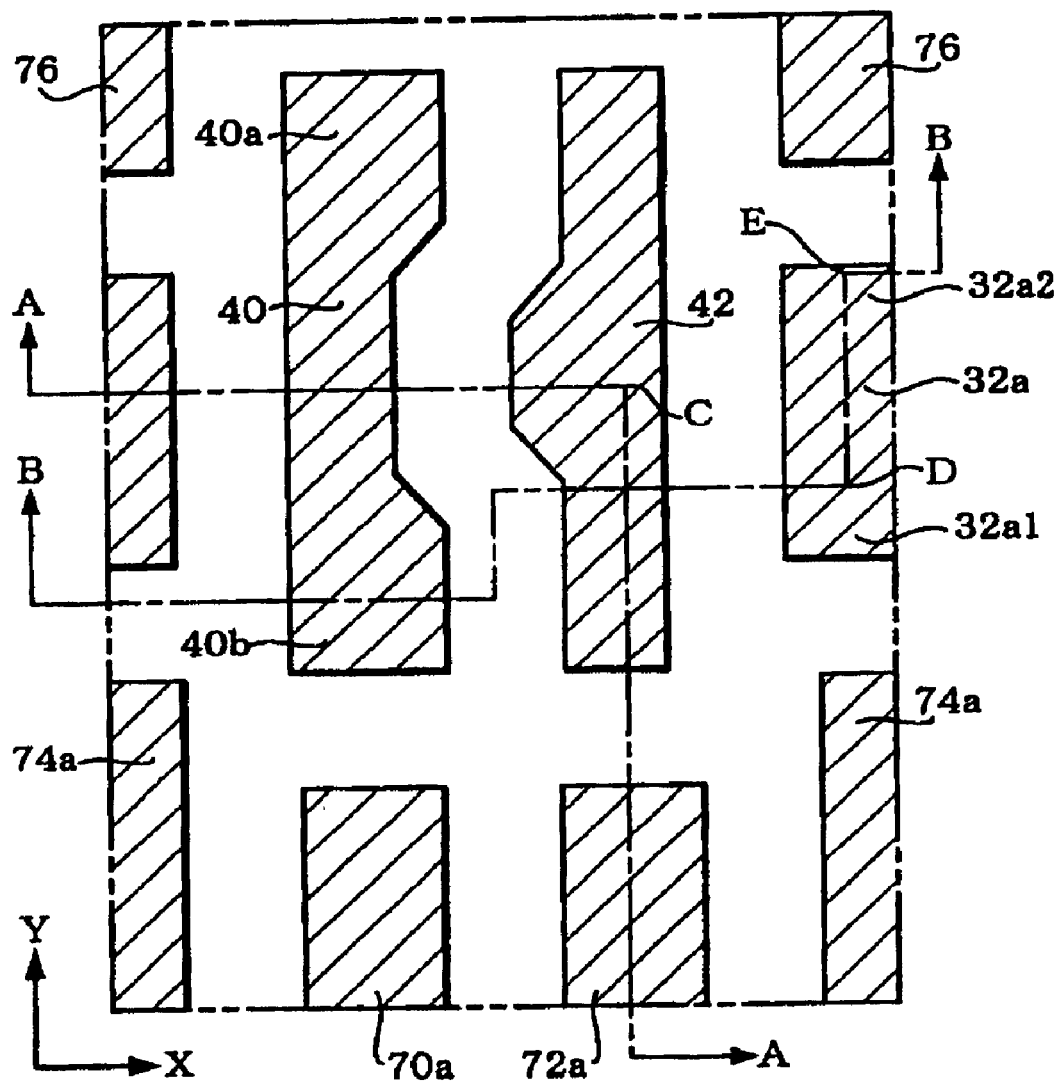
FIG. 4 schematically shows a plan view of a second conductive layer of the memory cell of the SRAM in accordance with the present embodiment.
Figure 5:
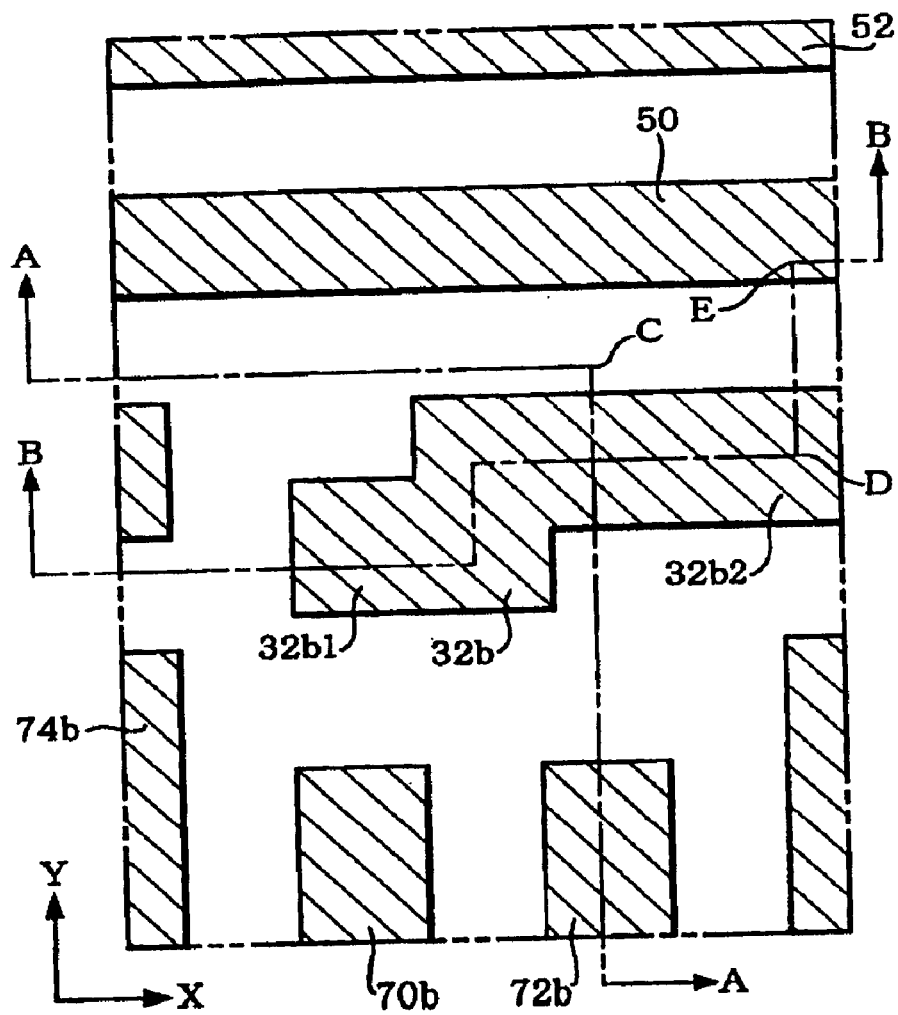
FIG. 5 schematically shows a plan view of a third conductive layer of the memory cell of the SRAM in accordance with the present embodiment.
Figure 6:
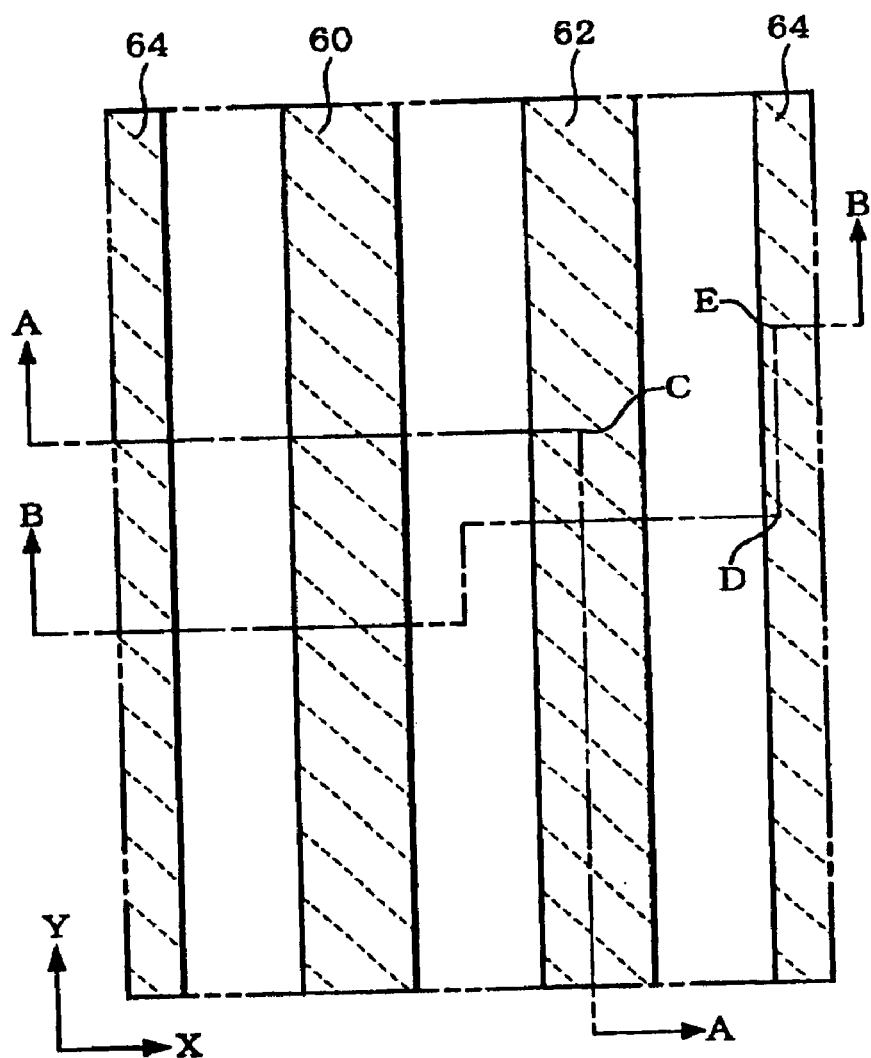
FIG. 6 schematically shows a plan view of a fourth conductive layer of the memory cell of the SRAM in accordance with the present embodiment.
Figure 7:
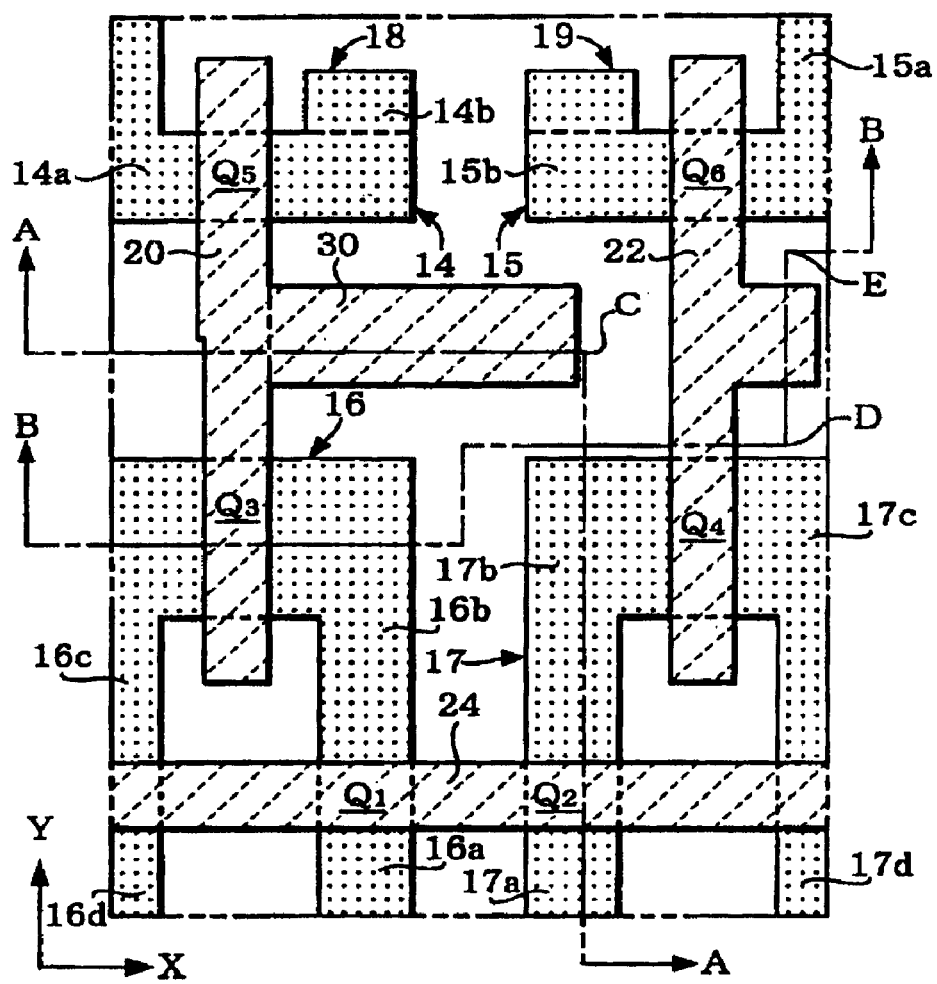
FIG. 7 schematically shows a plan view of the field and the first conductive layer of the memory cell of the SRAM in accordance with the present embodiment.
Figure 8:
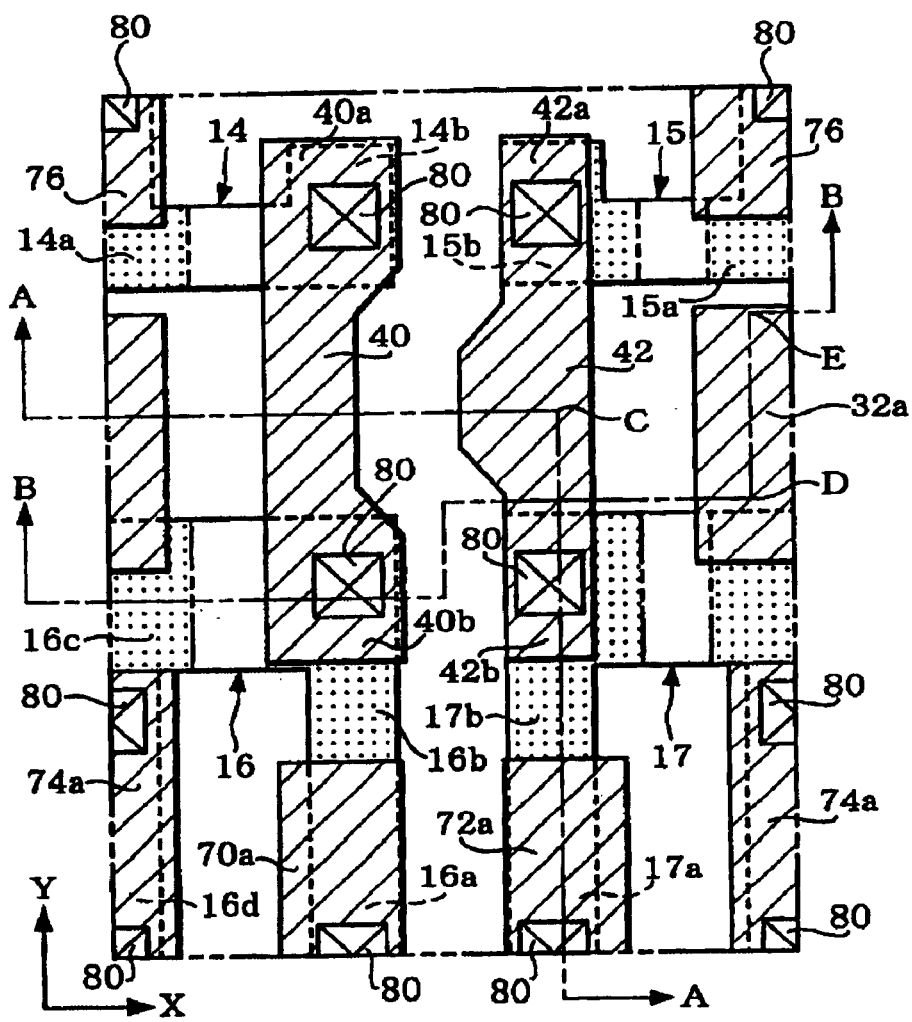
FIG. 8 schematically shows a plan view of the field and the second conductive layer of the memory cell of the SRAM in accordance with the present embodiment.
Figure 9:
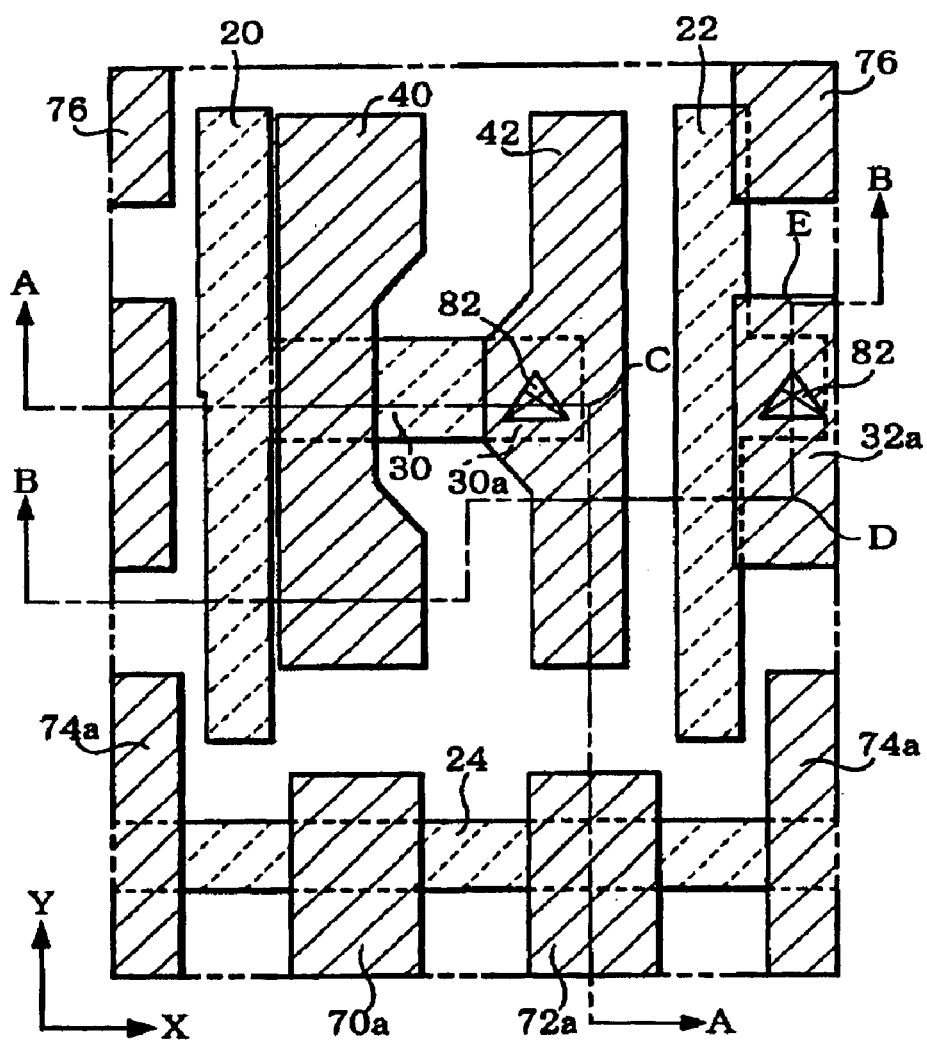
FIG. 9 schematically shows a plan view of the first conductive layer and the second conductive layer of the memory cell of the SRAM in accordance with the present embodiment.
Figure 10:
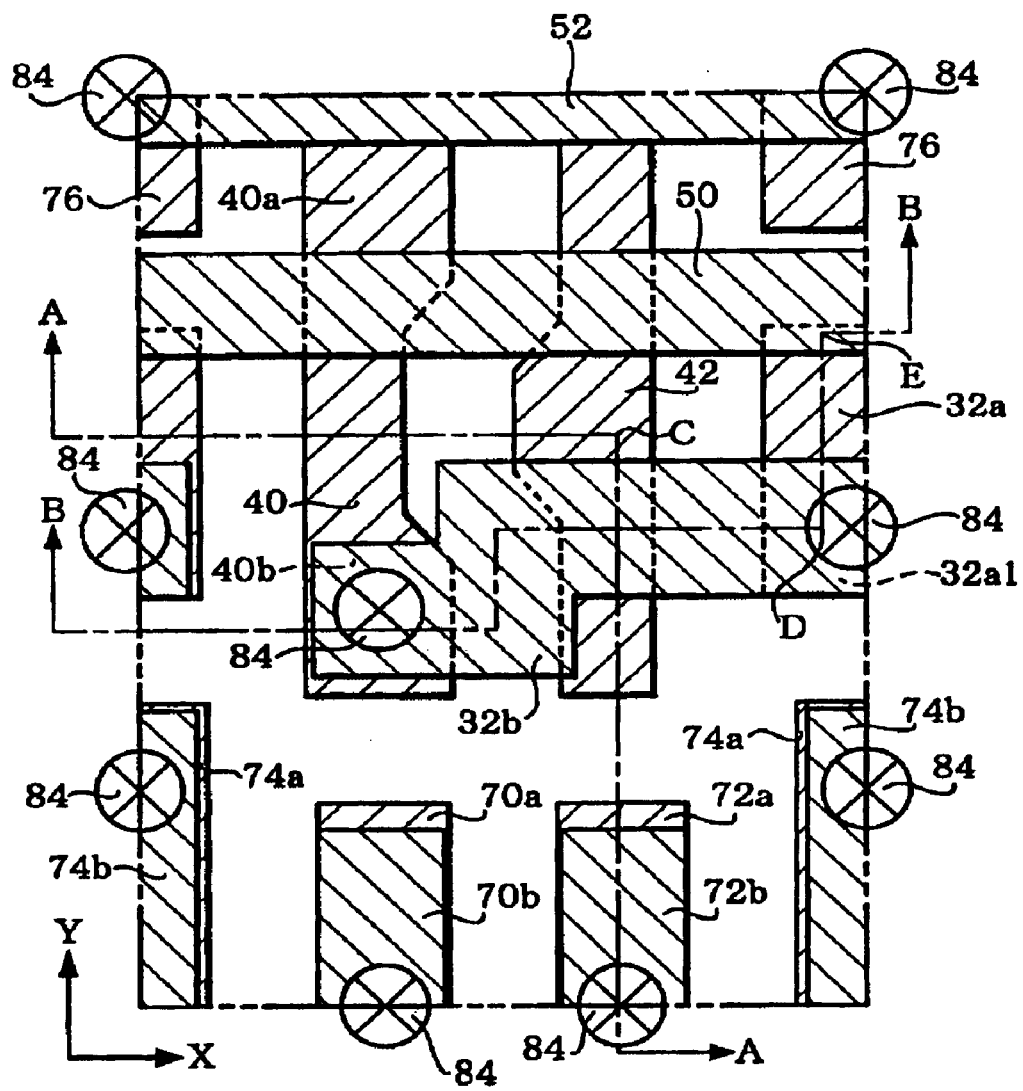
FIG. 10 schematically shows a plan view of the second conductive layer and the third conductive layer of the memory cell of the SRAM in accordance with the present embodiment.
Figure 11:
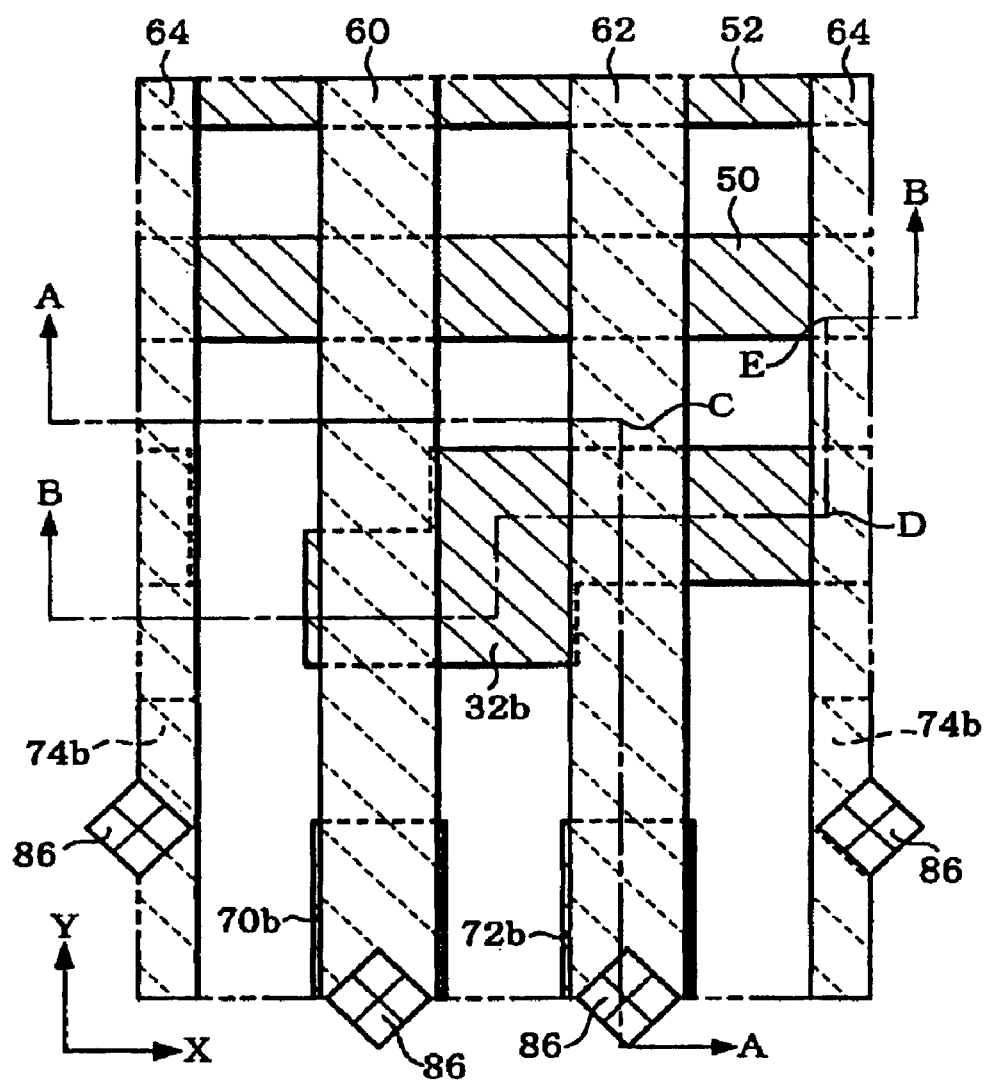
FIG. 11 schematically shows a plan view of the third conductive layer and the fourth conductive layer of the memory cell of the SRAM in accordance with the present embodiment.
Figure 12:
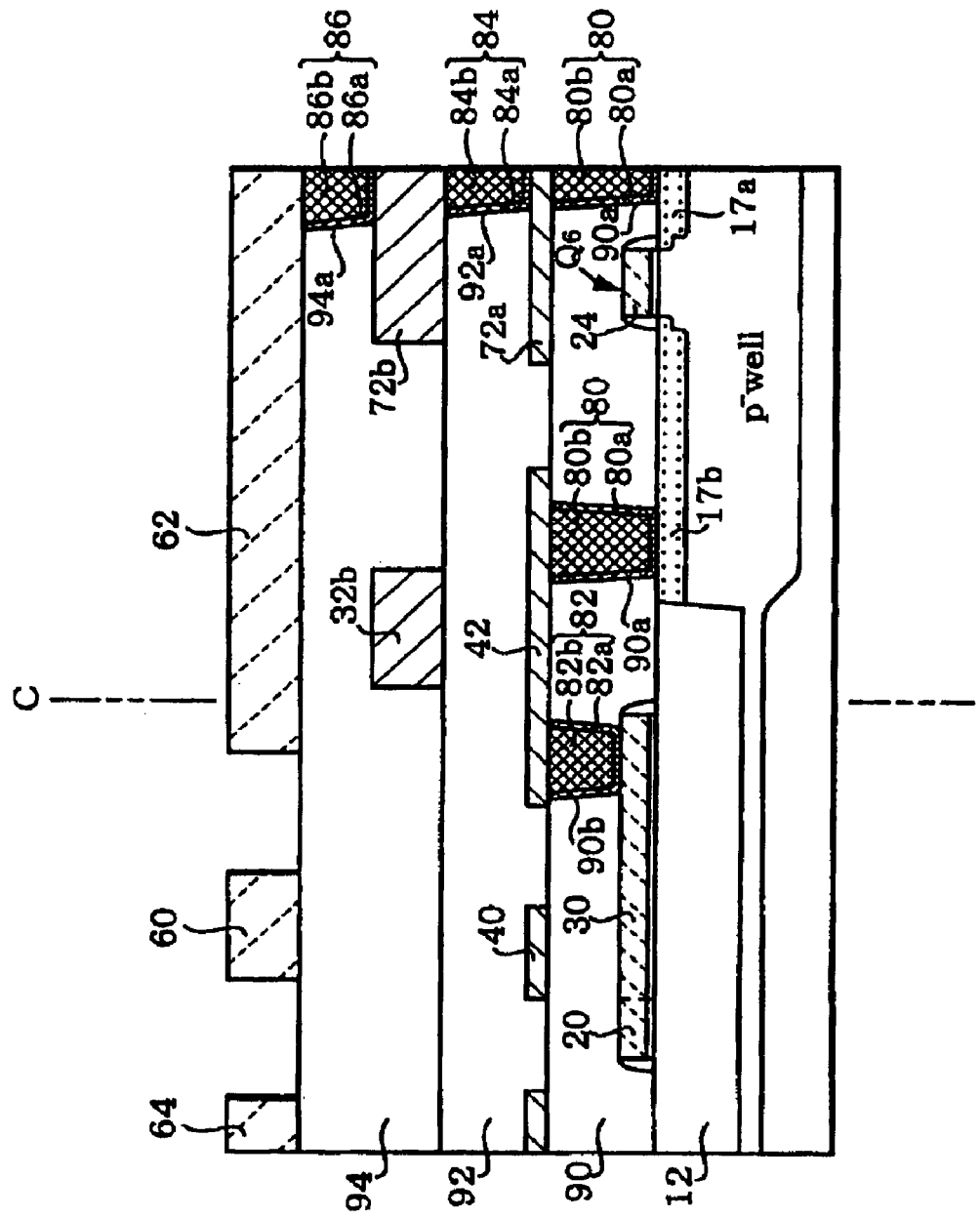
FIG. 12 schematically shows a cross-sectional view taken along a line A—A shown in FIG. 2 to FIG. 11.
Figure 13:
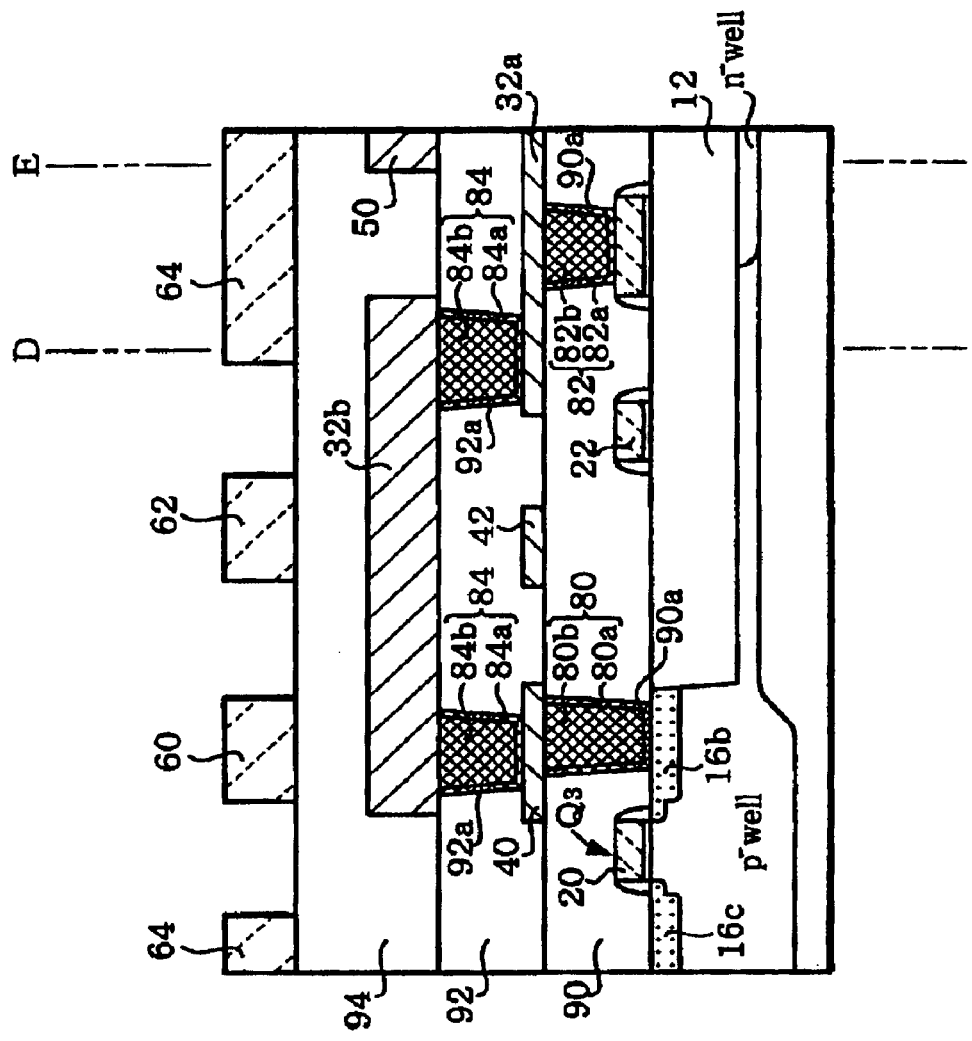
FIG. 13 schematically shows a cross-sectional view taken along a line B—B shown in FIG. 2 to FIG. 11.

FIG. 1 shows a relationship between an equivalent circuit of an SRAM in accordance with the present embodiment and corresponding conductive layers. FIG. 2 schematically shows a plan view of a field of the memory cell of the SRAM in accordance with the present embodiment. FIG. 3 schematically shows a plan view of a first conductive layer of the memory cell of the SRAM in accordance with the present embodiment. FIG. 4 schematically shows a plan view of a second conductive layer of the memory cell of the SRAM in accordance with the present embodiment. FIG. 5 schematically shows a plan view of a third conductive layer of the memory cell of the SRAM in accordance with the present embodiment. FIG. 6 schematically shows a plan view of a fourth conductive layer of the memory cell of the SRAM in accordance with the present embodiment. FIG. 7 schematically shows a plan view of the field and the first conductive layer of the memory cell of the SRAM in accordance with the present embodiment. FIG. 8 schematically shows a plan view of the field and the second conductive layer of the memory cell of the SRAM in accordance with the present embodiment. FIG. 9 schematically shows a plan view of the first conductive layer and the second conductive layer of the memory cell of the SRAM in accordance with the present embodiment. FIG. 10 schematically shows a plan view of the second conductive layer and the third conductive layer of the memory cell of the SRAM in accordance with the present embodiment. FIG. 11 schematically shows a plan view of the third conductive layer and the fourth conductive layer of the memory cell of the SRAM in accordance with the present embodiment. FIG. 12 schematically shows a cross-sectional view taken along a line A—A shown in FIG. 2 to FIG. 11. FIG. 13 schematically shows a cross-sectional view taken along a line B—B shown in FIG. 2 to FIG. 11.

The SRAM is formed including an element forming region formed in a field, a first conductive layer, a second conductive layer, a third conductive layer, and a fourth conductive layer. The structure of each of the field, and the first through fourth conductive layers is concretely described below.

2.1 Field

Referring to FIG. 2, the field is described. The field includes first through fourth active regions 14, 15, 16 and 17, first and second protruded active regions 18 and 19 and an element isolation region 12. The first through fourth active regions 14, 15, 16 and 17 and the first and second protruded active regions 18 and 19 are defined by the element isolation region 12. A region on the side where the first and second active regions 14 and 15 and the first and second protruded active regions 18 and 19 are formed is an n-type well region W10, and a region on the side where the third and fourth active regions 16 and 17 are formed is a p-type well region W20.

The first active region 14 and the first protruded active region 18, and the second active region 15 and the second protruded active region 19 are disposed in a symmetrical relation in a planar configuration. Also, the third active region 16 and the fourth active region 17 are disposed in a symmetrical relation in a planar configuration.

The first protruded active region 18 is provided in a manner to protrude from an end portion of the first active region 14. More concretely, the first protruded active region 18 may be provided in a manner to protrude toward a side opposite to the side where the p-well region W20 is formed. Also, a part of the first active region 14 and the first protruded active region 18 may form an L-shape. The first protruded active region 18 has a length L10, which is, for example, 0.14 $\mu$m to 0.20 $\mu$m. The first protruded active region 18 has a width W10, which is, for example, 0.18 $\mu$m to 0.22 $\mu$m. Effects provided by the provision of the first protruded active region 18 will be described below in section "Effects".

The second protruded active region 19 is provided in a manner to protrude from an end portion of the second active region 15. More concretely, the second protruded active region 19 may be provided in a manner to protrude toward a side opposite to the side where the p-well region W20 is formed. Also, a part of the second active region 15 and the second protruded active region 19 may form an L-shape. The second protruded active region 19 has a length L20, which is, for example, 0.14 $\mu$m to 0.20 $\mu$m. The second protruded active region 19 has a width W20, which is, for example, 0.18 $\mu$m to 0.22 $\mu$m. Effects provided by the provision of the second protruded active region 19 will be described below in section "Effects".

The first load transistor Q5 is formed in the first active region 14 and the first protruded active region 18. In the first active region 14, a first $p^+$-type impurity layer 14a is formed. In the first active region 14 and the first protruded active region 18, a second $p^+$-type impurity layer 14b is formed. The first $p^+$-type impurity layer 14a functions as a source of the first load transistor Q5. The second $p^+$-type impurity layer 14b functions as a drain of the first load transistor Q5.

The second load transistor Q6 is formed in the second active region 15 and the second protruded active region 19. In the second active region 15, a third $p^+$-type impurity layer 15a is formed. In the second active region 15 and the second protruded active region 19, a fourth $p^+$-type impurity layer 15b is formed. The third $p^+$-type impurity layer 15a functions as a source of the second load transistor Q6. The fourth $p^+$-type impurity layer 15b functions as a drain of the second load transistor Q6.

In the third active region 16, the first driver transistor Q3 and the first transfer transistor Q1 are formed. In the third active region 16, first through third $n^+$-type impurity layers 16a, 16b and 16c that are to become components of the transistors Q1 and Q3, and a fifth $p^+$-type impurity layer 16d that composes a well contact region are formed. The first $n^+$-type impurity layer 16a functions as a source or a drain of the first transfer transistor Q1. The second $n^+$-type impurity layer 16b functions as a drain of the first driver transistor Q3 and a source or a drain of the first transfer transistor Q1. The third $n^+$-type impurity layer 16c functions as a source of the first driver transistor Q3.

In the fourth active region 17, the second driver transistor Q4 and the second transfer transistor Q2 are formed. In the fourth active region 17, fourth through sixth $n^+$-type impurity layers 17a, 17b and 17c that are to become components of the transistors Q2 and Q4, and a sixth $p^+$-type impurity layer 17d that composes a well contact region are formed. The fourth $n^+$-type impurity layer 17a functions as a source or a drain of the second transfer transistor Q2. The fifth $n^+$-type impurity layer 17b functions as a drain of the second driver transistor Q4 and a source or a drain of the second transfer transistor Q2. The sixth $n^+$-type impurity layer 17c functions as a source of the second driver transistor Q4.

2.2 First Conductive Layer

Next, referring to FIG. 3 and FIG. 7, the first conductive layer is described. It is noted that the first conductive layer means a conductive layer that is formed on the field 10.

The first conductive layer includes a first gate-gate electrode layer 20, a second gate-gate electrode layer 22, a first drain-gate wiring layer 30 and an auxiliary word line 24.

The first gate-gate electrode layer 20 and the second gate-gate electrode layer 22 are formed in a manner to extend along a Y direction. The first drain-gate wiring layer 30 and the auxiliary word line 24 are formed in a manner to extend along an X direction.

Components of the first conductive layer are described concretely below.

1) First Gate-Gate Electrode Layer

The first gate-gate electrode layer 20 is formed in a manner to traverse the first active region 14 and the third active region 16, as shown in FIG. 7. The first gate-gate electrode layer 20 functions as a gate electrode of the first load transistor Q5 and the first driver transistor Q3.

The first gate-gate electrode layer 20 is formed in a manner to pass between the first $p^+$-type impurity layer 14a and the second $p^+$-type impurity layer 14b, in the first active region 14. In other words, the first gate-gate electrode layer 20, the first $p^+$-type impurity layer 14a and the second $p^+$-type impurity layer 14b form the first load transistor Q5. Also, the first gate-gate electrode layer 20 is formed in a manner to pass between the second $n^+$-type impurity layer 16b and the third $n^+$-type impurity layer 16c, in the third active region 16. In other words, the first gate-gate electrode layer 20, the second $n^+$-type impurity layer 16b and the third $n^+$-type impurity layer 16c form the first driver transistor Q3.

2) First Drain-Gate Wiring Layer

The first drain-gate wiring layer 30 is formed in a manner to extend in the X direction from a side section of the first gate-gate electrode layer 20 toward the second gate-gate electrode layer 22. Also, as shown in FIG. 7, the first drain-gate wiring layer 30 is formed at least between the first active region 14 and the third active region 16.

3) Second Gate-Gate Electrode Layer

The second gate-gate electrode layer 22 is formed in a manner to traverse the second active region 15 and the fourth active region 17, as shown in FIG. 7. The second gate-gate electrode layer 22 functions as a gate electrode of the second load transistor Q6 and the second driver transistor Q4.

The second gate-gate electrode layer 22 is formed in a manner to pass between the third $p^+$-type impurity layer 15a and the fourth $p^+$-type impurity layer 15b, in the second active region 15. In other words, the second gate-gate electrode layer 22, the third $p^+$-type impurity layer 15a and the fourth $p^+$-type impurity layer 15b form the second load transistor Q6. Also, the second gate-gate electrode layer 22 is formed in a manner to pass between the fifth $n^+$-type impurity layer 17b and the sixth $n^+$-type impurity layer 17c, in the fourth active region 17. In other words, the second gate-gate electrode layer 22, the fifth $n^+$-type impurity layer 17b and the sixth $n^+$-type impurity layer 17c form the second driver transistor Q4.

4) Auxiliary Word Line

The auxiliary word line 24 is formed in a manner to traverse the third active region 16 and the fourth active region 17, as shown in FIG. 7. The auxiliary word line 24 functions as a gate electrode of the first and second transfer transistors Q1 and Q2.

The auxiliary word line 24 is formed in a manner to pass between the first $n^+$-type impurity layer 16a and the second $n^+$-type impurity layer 16b, in the third active region 16. In other words, the auxiliary word line 24, the first $n^+$-type impurity layer 16a and the second $n^+$-type impurity layer 16b form the first transfer transistor Q1. Also, the auxiliary word line 24 is formed in a manner to pass between the fourth $n^+$-type impurity layer 17a and the fifth $n^+$-type impurity layer 17b, in the fourth active region 17. In other words, the auxiliary word line 24, the fourth $n^+$-type impurity layer 17a and the fifth $n^+$-type impurity layer 17b form the second transfer transistor Q2.

5) Cross-sectional Structure of First Conductive Layer and Others

The first conductive layer may be formed by successively depositing a polysilicon layer and a silicide layer in layers.

As shown in FIG. 12 and FIG. 13, a first interlayer dielectric layer 90 is formed on the field and the first conductive layer. The first interlayer dielectric layer 90 may be formed through a planarization process utilizing, for example, a chemical mechanical polishing method.

2.3 Second Conductive Layer

Referring to FIG. 4, FIG. 8 and FIG. 9, the second conductive layer is described below. It is noted that the second conductive layer means a conductive layer that is formed on the first interlayer dielectric layer 90.

The second conductive layer includes, as shown in FIG. 4, a first drain-drain wiring layer 40, a second drain-drain wiring layer 42, a lower layer 32a of the second drain-gate wiring layer, a first BL contact pad layer 70a, a first bar-BL contact pad layer 72a, a first Vss contact pad layer 74a and a Vdd contact pad layer 76.

The first drain-drain wiring layer 40, the second drain-drain wiring layer 42 and the lower layer 32a of the second drain-gate wiring layer are formed in a manner to extend in the Y direction (the load transistor and the driver transistor). The first drain-drain wiring layer 40, the second drain-drain wiring layer 42 and the lower layer 32a of the second drain-gate wiring layer are successively disposed in the X direction.

Components of the second conductive layer are concretely described below.

1) First Drain-Drain Wiring Layer

The first drain-drain wiring layer 40 has portions that overlap the first active region 14 and the third active region 16 as viewed in a plan view (see FIG. 8). More concretely, one end portion 40a of the first drain-drain wiring layer 40 is located above the second $p^+$-type impurity layer 14b. The one end portion 40a of the first drain-drain wiring layer 40 and the second $p^+$-type impurity layer 14b are electrically connected to each other through a contact section between the field and the second conductive layer (herein blew referred to as a "field/second-layer contact section") 80. The other end portion 40b of the first drain-drain wiring layer 40 is located above the second $n^+$-type impurity layer 16b. The other end portion 40b of the first drain-drain wiring layer 40 and the second $n^+$-type impurity layer 16b are electrically connected to each other through the field/second-layer contact section 80.

2) Second Drain-Drain Wiring Layer

The second drain-drain wiring layer 42 has portions that overlap the second active region 15 and the fourth active region 17 as viewed in a plan view (see FIG. 8). More concretely, one end portion 42a of the second drain-drain wiring layer 42 is located above the fourth $p^+$-type impurity layer 15b. The one end portion 42a of the second drain-drain wiring layer 42 and the fourth $p^+$-type impurity layer 15b are electrically connected to each other through the field/second-layer contact section 80. The other end portion 42b of the second drain-drain wiring layer 42 is located above the fifth $n^+$-type impurity layer 17b. The other end portion 42b of the second drain-drain wiring layer 42 and the fifth $n^+$-type impurity layer 17b are electrically connected to each other through the field/second-layer contact section 80.

Further, the second drain-drain wiring layer 42 has a portion that overlaps an end portion 30*a* of the first drain-gate wiring layer 30 as viewed in a plan view (see FIG. 9). The second drain-drain wiring layer 42 and the end portion 30*a* of the first drain-gate wiring layer 30 are electrically connected to each other through a contact section between the first conductive layer and the second conductive layer (hereafter referred to as a "first-layer/second-layer contact section") 82.

3) Lower Layer of Second Drain-Gate Wiring Layer

The lower layer 32*a* of the second drain-gate wiring layer is formed on the opposite side of the first drain-drain wiring layer 40 with respect to the second drain-drain wiring layer 42 as being a reference. The lower layer 32*a* of the second drain-gate wiring layer has a portion that overlaps the second gate-gate electrode layer 22 as viewed in a plan view (see FIG. 9). The lower layer 32*a* of the second drain-gate wiring layer, and the second gate-gate electrode layer 22 are electrically connected to each other through the first-layer/second-layer contact section 82.

4) First BL Contact Pad Layer

The first BL contact pad layer 70*a* is located above the first n$^+$-type impurity layer 16*a* in the third active region 16 (see FIG. 8). The first BL contact pad layer 70*a* and the first n$^+$-type impurity layer 16*a* are electrically connected to each other through the field/second-layer contact section 80.

5) First Bar-BL Contact Pad Layer

The first bar-BL contact pad layer 72*a* is located above the fourth n$^+$-type impurity layer 17*a* in the fourth active region 17 (see FIG. 8). The first bar-BL contact pad layer 72*a* and the fourth n$^+$-type impurity layer 17*a* are electrically connected to each other through the field/second-layer contact section 80.

6) First Vss Contact Pad Layer

The first Vss contact pad layers 74*a* are located above the sources of the driver transistors Q3 and Q4 (for example, the third n$^+$-type impurity layer 16*c*) and the well contact region (for example, the fifth p$^+$-type impurity layer 16*d*) (see FIG. 8). Each of the first Vss contact pad layers 74*a* is electrically connected to the source of each of the driver transistors Q3 and Q4 (for example, the third n$^+$-type impurity layer 16*c*) through the field/second-layer contact section 80. Also, the first Vss contact pad layer 74*a* is electrically connected to the well contact region (for example, the fourth p$^+$-type impurity layer 16*d*) through the field/second-layer contact section 80.

7) Vdd Contact Pad Layer

Each of the Vdd contact pad layers 76 is located above the source (for example, the first p$^+$-type impurity layer 14*a*) of each of the load transistors Q5 and Q6. Each of the Vdd contact pad layers 76 is electrically connected to the source (for example, the first p$^+$-type impurity layer 14*a*) of each of the load transistors Q5 and Q6 through the field/second-layer contact section 80.

8) Cross-Sectional Structure of Second Conductive Layer

Next, a cross-sectional structure of the second conductive layer is described with reference to FIG. 12 and FIG. 13. The second conductive layer may be formed only from, for example, a nitride layer of a refractory metal. The thickness of the second conductive layer may be for example 100 nm to 200 nm, and more specifically be 140 nm to 160 nm. The nitride layer of a refractory metal may be formed from, for example, titanium nitride. Because the second conductive layer is formed from a nitride layer of a refractory metal, the thickness of the second conductive layer can be made smaller, and miniature processing thereof can be readily conducted. Accordingly, the cell area can be reduced.

Also, the second conductive layer may be composed in either one of the following embodiments. 1) It may have a structure in which a nitride layer of a refractory metal is formed on a metal layer formed from a refractory metal. In this case, the metal layer formed from a refractory metal is an under-layer, and may be composed of a titanium layer, for example. Titanium nitride may be listed as a material of the nitride layer of a refractory metal. 2) The second conductive layer may be composed only of a metal layer of a refractory metal.

Next, a cross-sectional structure of the field/second-layer contact section 80 is described with reference to FIG. 12 and FIG. 13. The field/second-layer contact section 80 is formed in a manner to fill a through hole 90*a* that is formed in the first interlayer dielectric layer 90. The field/second-layer contact section 80 includes a barrier layer 80*a*, and a plug 80*b* formed over the barrier layer 80*a*. Titanium and tungsten may be listed as material of the plugs. The barrier layer 80*a* may be formed from a metal layer of a refractory metal, and a nitride layer of a refractory metal formed over the metal layer. For example, titanium may be listed as material of the metal layer of a refractory metal. Titanium nitride, for example, may be listed as material of the nitride layer of a refractory metal.

Next, a cross-sectional structure of the first-layer/second-layer contact section 82 is described with reference to FIG. 12 and FIG. 13. The first-layer/second-layer contact section 82 is formed in a manner to fill a through hole 90*b* that is formed in the first interlayer dielectric layer 90. The first-layer/second-layer contact section 82 may have the same structure as that of the field/second-layer contact section 80 described above.

A second interlayer dielectric layer 92 is formed in a manner to cover the second conductive layer. The second interlayer dielectric layer 92 may be formed through a planarization process using, for example, a chemical mechanical polishing method.

2.4 Third Conductive Layer

The third conductive layer is described below with reference to FIG. 5 and FIG. 10. It is noted that the third conductive layer means a conductive layer that is formed on the second interlayer dielectric layer 92 (see FIG. 12 and FIG. 13).

The third conductive layer includes an upper layer 32*b* of the second drain-gate wiring layer, a main word line 50, a Vdd wiring 52, a second BL contact pad layer 70*b*, a second bar-BL contact pad layer 72*b* and a second Vss contact pad layer 74*b*.

The upper layer 32*b* of the second drain-gate wiring layer, the main word line 50 and the Vdd wiring 53 are formed in a manner to extend along the X direction. The second BL contact pad layer 70*b*, the second bar-BL contact pad layer 72*b* and the second Vss contact pad layer 74*b* are formed in a manner to extend along the Y direction.

Components of the third conductive layer are concretely described below.

1) Upper Layer of The Second Drain-Gate Wiring Layer

The upper layer 32*b* of the second drain-gate wiring layer is formed in a manner to traverse the second drain-drain wiring layer 42 in the second conductive layer, as shown in FIG. 10. More concretely, the upper layer 32*b* of the second drain-gate wiring layer is formed from an area above the end portion 40*b* of the first drain-drain wiring layer 40 to an area above an end portion 32*a*1 of the lower layer 32*a* of the second drain-gate wiring layer. The upper layer 32*b* of the second drain-gate wiring layer is electrically connected to the end portion 40*b* of the first drain-drain wiring layer 40 through a contact section between the second conductive layer and the third conductive layer (herein after referred to as a "second-layer/third-layer contact section") 84. Also, the upper layer 32b of the second drain-gate wiring layer is electrically connected to the end portion 32a1 of the lower layer 32a of the second drain-gate wiring layer through the second-layer/third-layer contact section 84.

As shown in FIG. 1, the first drain-drain wiring layer 40 in the second conductive layer and the second gate-gate electrode layer 22 in the first conductive layer are electrically connected to each other through the second-layer/third-layer contact section 84, the upper layer 32b of the second drain-gate wiring layer, the second-layer/third-layer contact section 84, the lower layer 32a of the second drain-gate wiring layer, and the first-layer/second-layer contact section 82.

2) Vdd Wiring

The Vdd wiring 52 is formed in a manner to pass over the Vdd contact pad layer 76, as shown in FIG. 10. The Vdd wiring 52 is electrically connected to the Vdd contact pad layer 76 through the second-layer/third-layer contact section 84.

3) Second BL Contact Pad Layer

The second BL contact pad layer 70b is located above the first BL contact pad layer 70a. The second BL contact pad layer 70b is electrically connected to the first BL contact pad layer 70a through the second-layer/third-layer contact section 84.

4) Second Bar-BL Contact Pad Layer

The second bar-BL contact pad layer 72b is located above the first bar-BL contact pad layer 72a. The second bar-BL contact pad layer 72b is electrically connected to the first bar-BL contact pad layer 72a through the second-layer/third-layer contact section 84.

5) Second Vss Contact Pad Layer

The second Vss contact pad layer 74b is located above the second Vss contact pad layer 74a. The second Vss contact pad layer 74b is electrically connected to the first Vss contact pad layer 74a through the second-layer/third-layer contact section 84.

6) Cross-sectional Structure of Third Conductive Layer

Next, a cross-sectional structure of the third conductive layer is described with reference to FIG. 12 and FIG. 13. The third conductive layer has a structure in which, for example, a nitride layer of a refractory metal, a metal layer, and a nitride layer of a refractory metal, in this order from the bottom, are successively stacked in layers. For example, titanium nitride may be listed as material of the nitride layer of a refractory metal. Aluminum, copper or an alloy of these metals, for example, may be listed as material of the metal layer.

Next, a cross-sectional structure of the second-layer/third-layer contact section 84 is described. The second-layer/third-layer contact section 84 is formed in a manner to fill a through hole 92a formed in the second interlayer dielectric layer 92. The second-layer/third-layer contact section 84 may be provided with the same structure as that of the field/second-layer contact section 80 described above.

A third interlayer dielectric layer 94 is formed in a manner to cover the third conductive layer. The third interlayer dielectric layer 94 may be formed through a planarization process using, for example a chemical mechanical polishing method.

2.5 Fourth Conductive Layer

The fourth conductive layer is described below with reference to FIG. 6 and FIG. 11. It is noted that the fourth conductive layer means a conductive layer that is formed on the third interlayer dielectric layer 94.

The fourth conductive layer includes a bit line 60, a bit-bar line 62 and a Vss wiring 64.

The bit line 60, the bit-bar line 62 and the Vss wiring 64 are formed in a manner to extend along the Y direction.

Compositions of the bit line 60, the bit-bar line 62 and the Vss wiring 64 are concretely described below.

1) Bit Line

The bit line 60 is formed in a manner to pass over the second BL contact pad layer 70b, as shown in FIG. 11. The bit line 60 is electrically connected to the second BL contact pad layer 70b through a contact section between the third conductive layer and the fourth conductive layer (herein below referred to as a "third-layer/fourth-layer contact section") 86.

2) Bar-Bit Line

The bit-bar line 62 is formed in a manner to pass over the second bar-BL contact pad layer 72b, as shown in FIG. 11. The bit-bar line 62 is electrically connected to the second bar-BL contact pad layer 72b through the third-layer/fourth-layer contact section 86.

3) Vss Wiring

The Vss wiring 64 is formed in a manner to pass over the second Vss contact pad layer 74b, as shown in FIG. 11. The Vss wiring 64 is electrically connected to the second Vss contact pad layer 74b through the third-layer/fourth-layer contact section 86.

4) Cross-Sectional Structure of Fourth Conductive Layer

Next, a cross-sectional structure of the fourth conductive layer is described with reference to FIG. 12 and FIG. 13. The fourth conductive layer may have the same structure as the structure of the third conductive layer described above.

Next, a cross-sectional structure of the third-layer/fourth-layer contact section 86 is described. The third-layer/fourth-layer contact section 86 is formed in a manner to fill a through hole 94a that is formed in the third interlayer dielectric layer 94. The third-layer/fourth-layer contact section 86 may have the same structure as the structure of the field/second-layer contact section 80 described above.

Although not shown in FIG. 12 or FIG. 13, a passivation layer may be formed on the fourth conductive layer.

3. Effects

Effects provided by the semiconductor device in accordance with the present embodiment are described below.

(1) A first drain-gate wiring layer and a second drain-gate wiring layer could be formed in the same conductive layer. However, in this case, it is difficult to reduce the cell area due to the high pattern density of the conductive layer where the first and second drain-gate wiring layers are formed.

However, in accordance with the present embodiment, the first drain-gate wiring layer 30 is located in the first conductive layer. Also, the second drain-gate wiring layer has a structure that is divided into the lower layer 32a of the second drain-gate wiring layer and the upper layer 32b of the second drain-gate wiring layer. The lower layer 32a of the second drain-gate wiring layer is located in the second conductive layer, and the upper layer 32b of the second drain-gate wiring layer is located in the third conductive layer. Consequently, the first drain-gate wiring layer and the second drain-gate wiring layer are formed in different layers, respectively. Accordingly, since the first drain-gate wiring layer and the second drain-gate wiring layer are not formed in the same layer, the pattern density of the wiring layer can be reduced. Therefore, by the memory cell in accordance with the present embodiment, the cell area can be reduced.

(2) In the present embodiment, the first protruded active region 18 that protrudes from an end portion of the first active region 14 is provided. The resultant effects are described below.

Figure 17A:
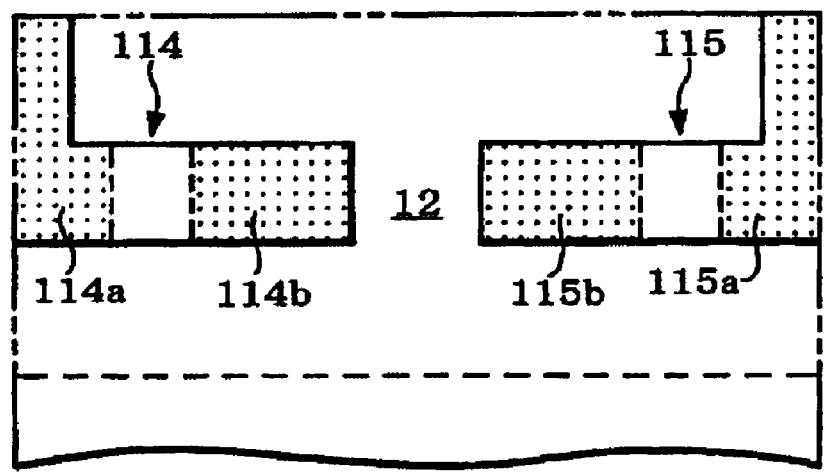
FIG. 17A schematically shows a plan view of a plane of an active region of an example for comparison.
Figure 17B:
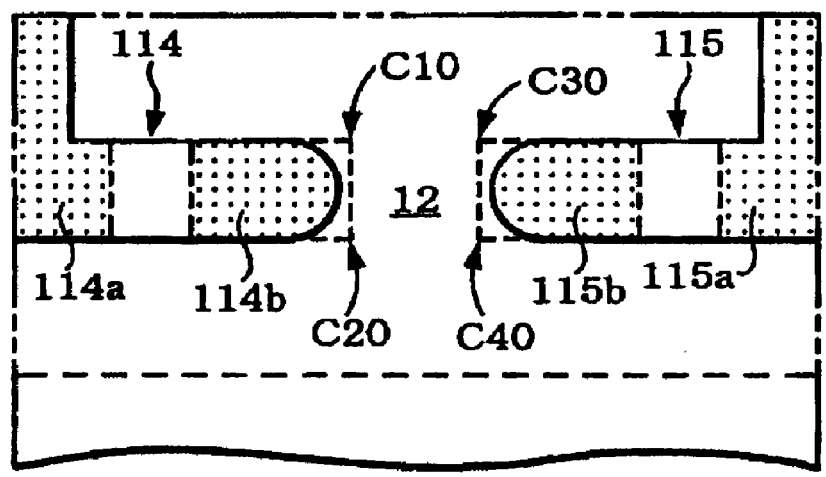
FIG. 17B is an illustration to describe problems of the example for comparison.

As an example for comparison, let us consider the case in which active regions 114 and 115 having a pattern shown in FIG. 17A are formed. In other words, let us consider the case in which protruded active regions that protrude from the end portions of the active regions 114 and 115 are not formed. When the active regions 114 and 115 are formed, their patterns are defined by a resist pattern. In the mean time, when a resist pattern having corner sections is formed, the resist pattern at the corner sections may be rounded due to the approximation effect. Accordingly, as shown in FIG. 17B, the active regions 114 and 115 may be formed with the patterns at corner sections C10, C20, C30 and C40 being rounded. When the corner sections C10, C20, C30 and C40 at the ends are rounded, the area of each of the active regions 114 and 115 is reduced accordingly. Therefore, contact areas between the impurity layers (for example, drain regions) 114b and 115b and the contact sections are reduced. As the contact areas are reduced, the contact resistance between the impurity layers 114b and 115b and the contact sections becomes greater.

In accordance with the present embodiment, the first protruded active region 18 that protrudes from the end portion of the first active region 14 is provided. As a result, the first protruded active region 18 may be rounded due to the approximation effect, the first active region 14 is prevented from being rounded, and the reduction of the area of the first active region 14 can be prevented. Accordingly, the contact area between the impurity layer 14b and the contact section 80 can be securely provided. As a result, the contact resistance between the impurity layer 14b and the contact section 80 can be prevented from increasing.

Also, in accordance with the present embodiment, the second protruded active region 19 that protrudes from the end portion of the first active region 15 is provided. Therefore, for the same reasons as described above, the contact resistance between the impurity layer 15b and the contact section 80 can be prevented from increasing.

(3) Also, in accordance with the present embodiment, the first and second protruded active regions 18 and 19 may be provided in a manner to protrude toward the sides opposite to the sides where the p-well region W20. In other words, the first and second protruded active regions 18 and 19 may be provided in a manner to protrude toward the sides opposite to the sides where the driver transistors Q3 and Q4 are provided. In this case, the first and second protruded active regions 18 and 19 can be prevented from reaching the p-well region W20. Also, the first and second protruded active regions 18 and 19 are prevented from being short-circuited with the first drain-gate wiring layer 30.

4. Example of Application of SRAM to Electronic Equipment

Figure 14:
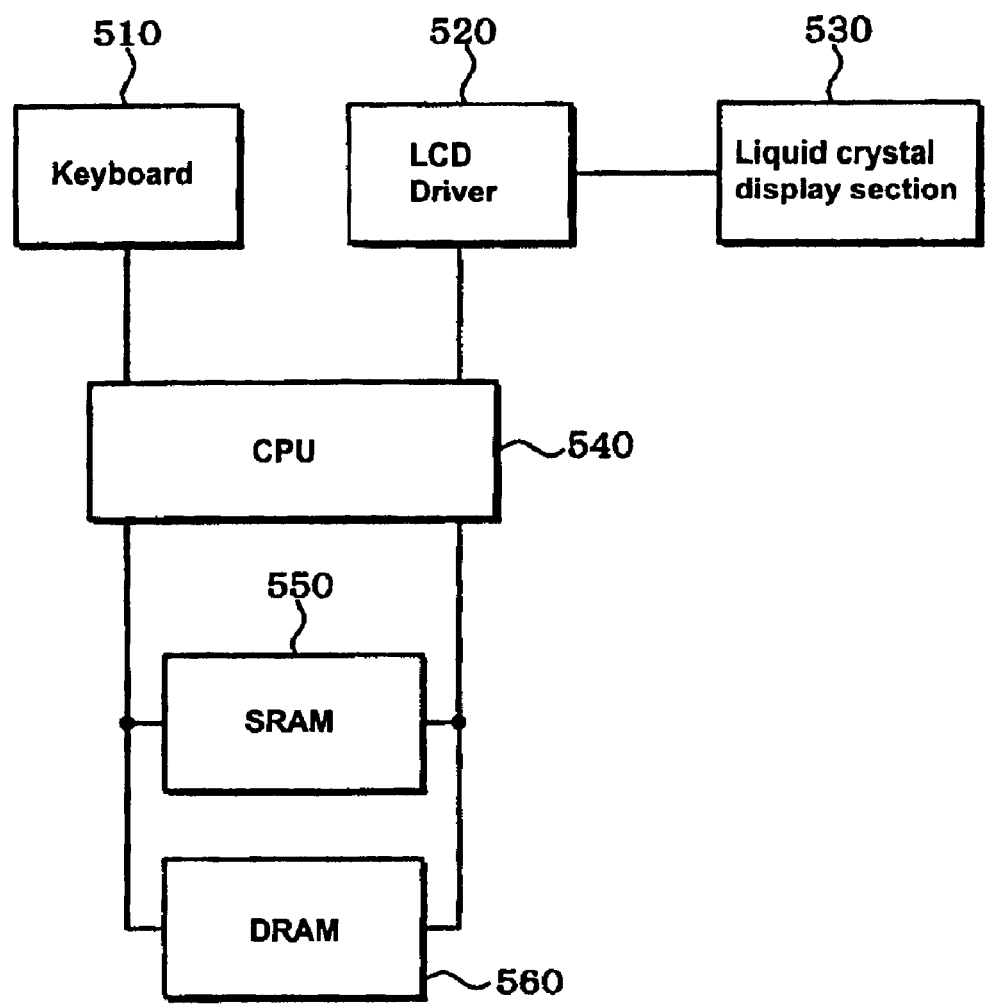
FIG. 14 shows a block diagram of a part of a mobile telephone system provided with the SRAM in accordance with the present embodiment.

The SRAM in accordance with the present embodiment may be applied to electronic equipment, such as, for example, mobile equipment. FIG. 14 shows a block diagram of a part of a mobile telephone system. A CPU 540, an SRAM 550 and a DRAM 560 are mutually connected via a bus line. Further, the CPU 540 is connected to a keyboard 510 and an LCD driver 520 via the bus line. The LCD driver 520 is connected to a liquid crystal display section 530 via the bus line. The CPU 540, the SRAM 550 and the DRAM 560 compose a memory system.

Figure 15:
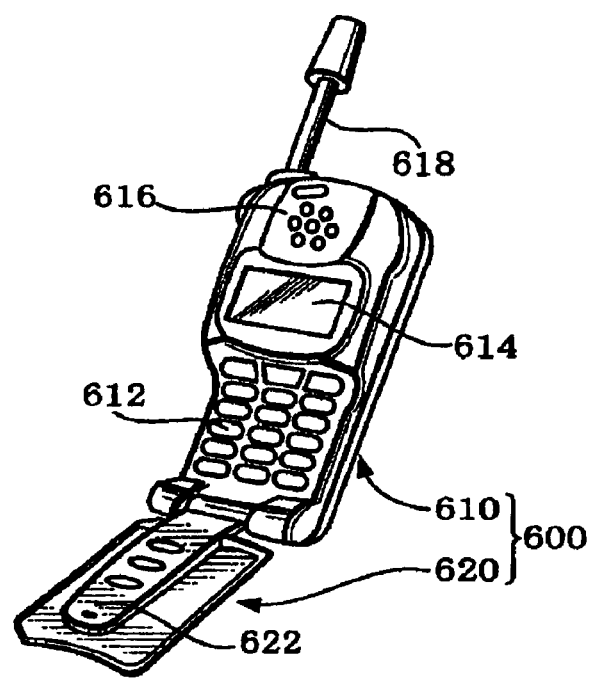
FIG. 15 shows a perspective view of a mobile telephone that is provided with the mobile telephone system shown in FIG. 14.
Figure 16:
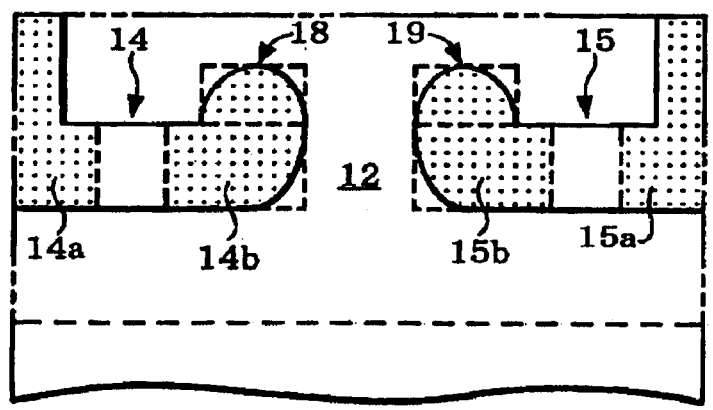
FIG. 16 is an illustration to describe the effects of the present embodiment.

FIG. 15 shows a perspective view of a mobile telephone 600 that is provided with the mobile telephone system shown in FIG. 14. The mobile telephone 600 is equipped with a main body section 610 including a keyboard 612, a liquid crystal display section 614, a receiver section 616 and an antenna section 618, and a lid section 620 including a transmitter section 622.

The present invention is not limited to the embodiment described above, and a variety of modifications can be made within the scope of the subject matter of the present invention.

It is noted that, in the embodiment described above, the load transistor and the driver transistor on the left side are defined as the first load transistor and the first driver transistor, respectively. However, the load transistor and the driver transistor on the right side may be defined as the first load transistor and the first driver transistor, respectively.

What is claimed is:

1. A semiconductor device provided with a memory cell including a first driver transistor, a second driver transistor, a first transfer transistor, a second transfer transistor, a first load transistor and a second load transistor, the semiconductor device comprising:

a first gate-gate electrode layer including a gate electrode of the first load transistor and a gate electrode of the first driver transistor, a second gate-gate electrode layer including a gate electrode of the second load transistor and a gate electrode of the second driver transistor, a first drain-drain wiring layer which forms a part of a connection layer that electrically connects a drain region of the first load transistor and a drain region of the first driver transistor;

a second drain-drain wiring layer which forms a part of a connection layer that electrically connects a drain region of the second load transistor and a drain region of the second driver transistor;

a first drain-gate wiring layer which forms a part of a connection layer that electrically connects the first gate-gate electrode layer and the second drain-drain wiring layer;

a second drain-gate wiring layer which forms a part of a connection layer that electrically connects the second gate-gate electrode layer and the first drain-drain wiring layer; and a first active region in which the first load transistor is provided, wherein the first drain-gate wiring layer and the second drain-gate wiring layer are located in different layer levels, respectively, and wherein a first protruded active region is provided in a manner to protrude from an end portion of the first active region, and wherein the second drain-gate wiring layer includes a lower layer of the second drain-gate wiring layer and an upper layer of the second drain-gate wiring layer; and wherein the upper layer is located in a layer over the lower layer, and electrically connected to the lower layer; and wherein the first gate-gate electrode layer, the second gate-gate electrode layer and the first drain-gate wiring layer are located in a first conductive layer level; and wherein the first drain-drain wiring layer, the second drain-drain wiring layer and the lower layer are located in a second conductive layer level; and wherein the upper layer is located in a third conductive layer level.

2. The semiconductor device according to claim 1, wherein the first protruded active region is provided in a manner to protrude on a side opposite to a side where the first and second driver transistors are provided.

3. The semiconductor device according to claim 1, wherein a part of the first active region and the first protruded active region form an L-shape.

4. The semiconductor device according to claim 1, comprises:

a second active region in which the second load transistor is provided; and a second protruded active region provided in a manner to protrude from an end portion of the second active region.

5. The semiconductor device according to claim 4, wherein the second protruded active region is provided in a manner to protrude on a side opposite to a side where the first and second driver transistors are provided.

6. The semiconductor device according to claim 4, wherein a part of the second active region and the second protruded active region form an L-shape.

7. The semiconductor device according to claim 1, wherein the first drain-gate wiring layer is electrically connected to the second drain-drain wiring layer through a contact section, and wherein the second drain-gate wiring layer is electrically connected to the second gate-gate electrode layer through a contact section, and electrically connected to the first drain-drain wiring layer through a contact section.

8. The semiconductor device according to claim 1, wherein the first drain-gate wiring layer is located in a layer lower than the second drain-gate wiring layer.

9. The semiconductor device according to claim 1, wherein the first drain-gate wiring layer is located in a layer in which the first gate-gate electrode layer is provided.

10. The semiconductor device according to claim 1, wherein the second drain-gate wiring layer is formed across a plurality of layers.

11. The semiconductor device according to claim 10, wherein the upper layer is electrically connected to the lower layer through a contact section.

12. The semiconductor device according to claim 10, wherein the second conductive layer level is a nitride layer of a refractory metal.

13. The semiconductor device according to claim 10, wherein the second conductive layer has a thickness of 100 nm to 200 nm.

14. A memory system provided with the semiconductor device defined in any one of claims 1–10, 11, and 12–13.

15. An electronic apparatus provided with the semiconductor device defined in any one of claims 1–10, 11 and 12–13.

\* \* \* \* \*